United States Patent [19]

Lindén et al.

[11] Patent Number: 5,037,313
[45] Date of Patent: Aug. 6, 1991

[54] ACTIVE PLUG-IN FUNCTION UNIT

[75] Inventors: Kjell J. E. Lindén, Stockholm; Per E. Beckman, Mölndal, both of Sweden

[73] Assignee: Telefonaktiebolaget L M Ericsson, Stockholm, Sweden

[21] Appl. No.: 530,412

[22] Filed: May 30, 1990

[30] Foreign Application Priority Data

Jun. 28, 1989 [SE] Sweden .............................. 8902342-8

[51] Int. Cl.$^5$ .............................................. H01R 9/09
[52] U.S. Cl. ...................... 439/76; 439/483; 439/487; 361/386
[58] Field of Search ............ 439/55, 59, 61, 483, 439/485, 487, 76, 620; 174/16.3; 361/395, 399, 415, 413, 383, 386, 388; 165/80.1, 80.2, 80.3

[56] References Cited

U.S. PATENT DOCUMENTS

| | | | |
|---|---|---|---|
| 4,093,021 | 6/1978 | Groom | 165/80.3 X |
| 4,313,144 | 1/1982 | Waddington | 360/132 |
| 4,313,147 | 1/1982 | Uchida et al. | 361/119 |
| 4,369,485 | 1/1983 | Bell et al. | 361/386 |
| 4,432,038 | 2/1984 | Bell | 361/386 |
| 4,716,498 | 12/1987 | Ellis | 361/386 |
| 4,811,165 | 3/1989 | Currier et al. | 361/386 |
| 4,829,244 | 5/1989 | Tom et al. | 370/85.1 X |

OTHER PUBLICATIONS

IBM Technical Bulletin, vol. 20, No. 1, Corso et al., p. 142.

Primary Examiner—Neil Abrams
Assistant Examiner—Khiem Nguyen
Attorney, Agent, or Firm—Burns, Doane, Swecker & Mathis

[57] ABSTRACT

The present invention relates to an active plug-in function unit, intended for plugging into a multipolar plug contact device on a circuit board or back plane, and comprises a base plate, a connector, an electronic circuit and a cover. According to the invention, the connector is a module-type multipolar sleeve connector (3) mounted on one end of the base plate (2), the base plate extending in the direction of the sleeve connectors. The electronic circuit (4) is mounted on the base plate (2) and connected to the sleeve connectors. The cover (5) is preferably made of metal and is placed over the electronic circuit (4) and, together with the base plate (2) and the sleeve connector (3), forms an EMC-casing around the circuit. The dimensions of the function unit are such that its projection, when plugged into the circuit board (A) or the back plane (B), falls within the dimensions of the plug contact device (C).

11 Claims, 3 Drawing Sheets

ACTIVE PLUG-IN FUNCTION UNIT

TECHNICAL FIELD

The present invention relates to an active plug-in function unit which is intended to be plugged into a multipolar plug contact device mounted on a circuit board or back plane and comprising a base plate, a connection device, an electronic circuit and a lid or cover.

BACKGROUND ART

The various system functions of present day telecommunication systems are built-up and integrated on circuit boards or in back planes. The system functions are adapted to those applications utilized at that time, for instance with respect to incoming and outgoing signal links between various units in the telecommunication system.

A drawback with present day solutions is that the construction and positioning of the system functions cannot always be effected in a unitary and optimum fashion from a functional aspect, primarily due to the lack of flexibility. This results in unnecessarily extensive and bulky solutions, which at times also tend to create duplicate, similar functions in series. The possibility of congregating and positioning the functions where they can do the most good is lacking, which renders the present day methods of building the system functions divided and unstructured.

Other drawbacks lie in the necessity of changing a complete circuit board in the event of an error or fault in a given system function. Similarly, running modifications to and upgrading of system functions, such as transitions from a coaxial cable to an opto-cable also necessitates the replacement of a complete circuit board, which entails a significant amount of work and time losses.

DISCLOSURE OF THE INVENTION

The object of the present invention is to provide an active plug-in function unit which is constructed a detached system function in a highly compact form. This object is achieved with an active plug-in function unit having the characteristic features set forth in the accompanying claims.

Function units that are constructed in accordance with the invention afford several advantages. One advantage is that different units having separate functions present a common electrical interface to the telecommunication system and are therefore mutually compatible. Another advantage is that repairs are facilitated, since each function unit containing a particular system function can be replaced simply and quickly, thereby also improving the reliability of the telecommunication system. Another advantage is that system functions which today are spread-out on circuit boards can now be concentrated to form a compact plug-in function unit. This enables functions to be gathered and positioned where they do the most good, with the shortest possible conductor paths, which in addition to providing more space on the circuit board also enables a divided and unstructured building method to be avoided.

According to one embodiment of the invention, the plug-in function unit can also include a cable connector which forms a mechanically separable or dividable interface to an incoming or outgoing cable. This embodiment with two separable interfaces facilitates installation, since only cables need be handled. The plug-in function unit can then be used as an adapter for different types of cable connectors. One advantage afforded hereby is that system functions to subscriber lines can be continuously adapted more simply and more quickly than was previously possible. Upgrading of systems can also be effected quickly and easily, for instance transitions from coaxial cables to opto-cables, since it is only necessary to change the plug-in function unit and the cable.

The invention will now be described in more detail with reference to preferred embodiments illustrated in the accompanying drawings, further advantages afforded by the invention being made apparent in conjunction therewith.

THE BEST MODES OF CARRYING OUT THE INVENTION

Figure 1:
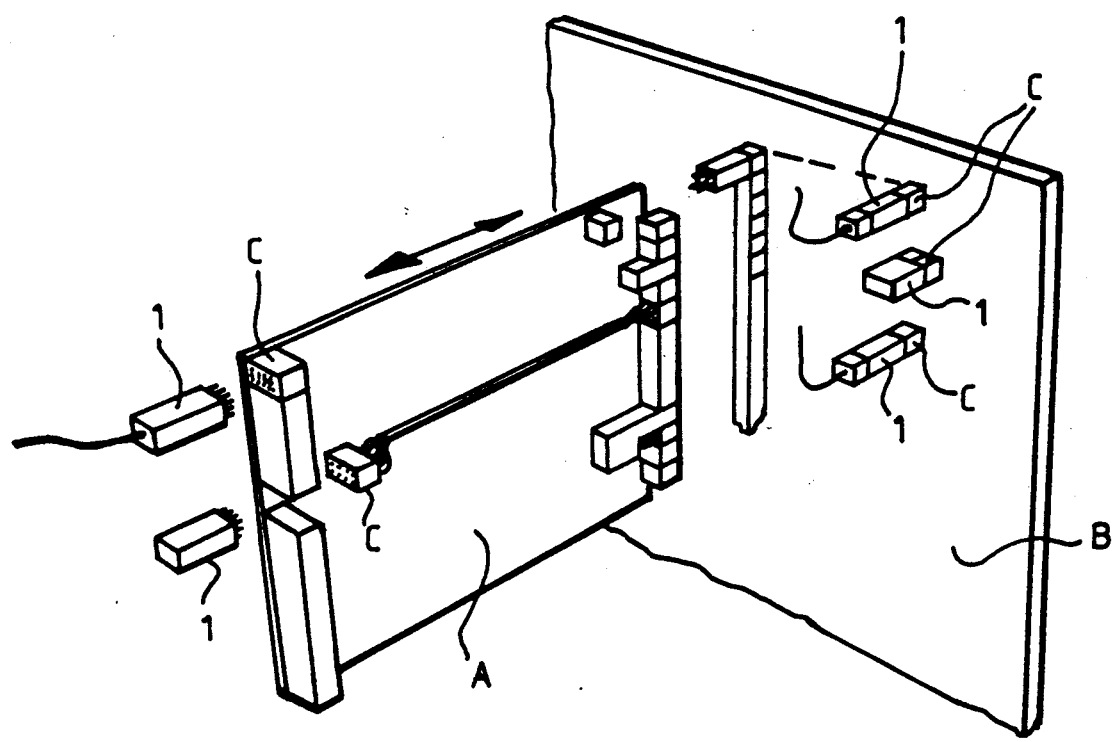
FIG. 1 illustrates the general use of active plug-in function units in accordance with the invention.

FIG. 1 illustrates generally the manner in which an inventive active plug-in function unit 1 can be plugged into a contact device C mounted on a circuit board A or a back plane B incorporated in telecommunication equipment. The function units 1 include a system function which can be divided into substantially three areas, namely links, signal protection and power distribution. Examples of link functions include converters and amplifiers, whereas the signal-protection function may comprise signal filters or excess voltage protection. The function unit 1 exhibits two mechanically separable interfaces within these two main areas, i.e. a separable interface to the circuit board A or the back plane B, and a separable interface to an incoming or outgoing cable. The function unit presents only one mechanically separable interface to the circuit board or the back plane within the third main area. Examples of functions within this area include DC/DC-rectifiers and power filters.

Figure 2:
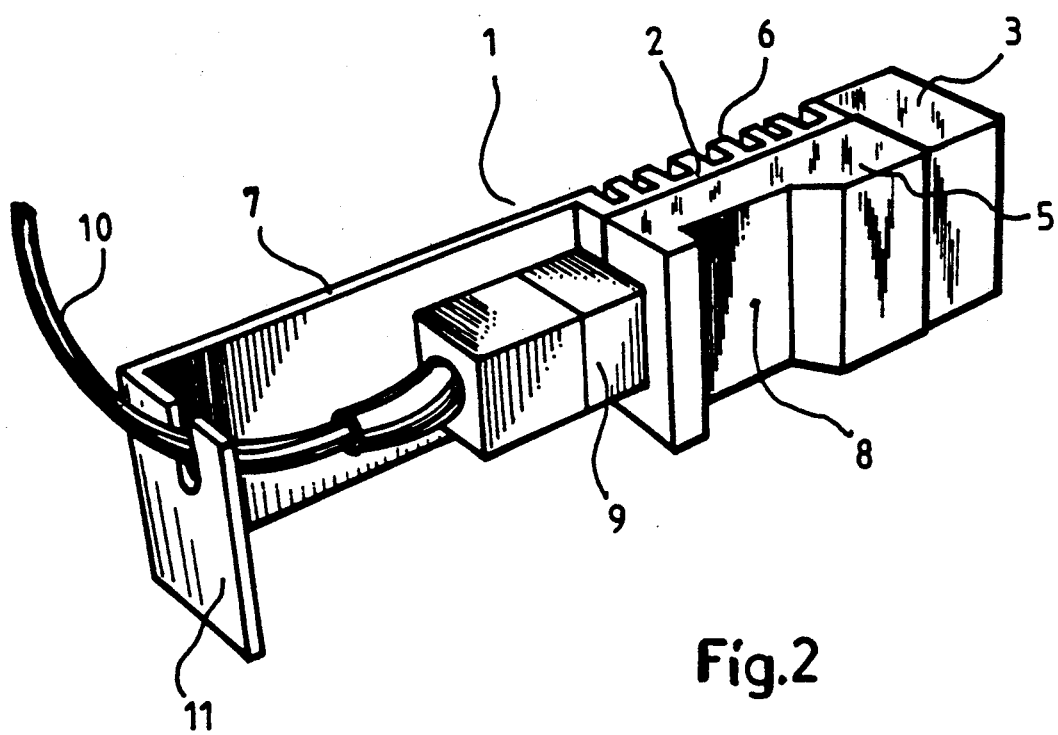
FIG. 2 illustrates in perspective one example of an inventive active plug-in function unit.

FIG. 2 illustrates an exemplifying embodiment of an inventive plug-in function unit 1. The unit includes a base plate 2, which is attached to a module-type multipolar sleeve connector 3 at one end thereof. The connector forms the mechanically separable electric interface of the function unit to the circuit board A or the back plane B. Mounted on the base plate is an electronic circuit 4, which may consist of a circuit board or a substrate glued to the base plate and connected to the pins of the connector 3 in some suitable manner. Finally, the unit includes a cover 5 which extends over the electronic circuit 4 of the base plate 2 and which is connected to the connector 3. The cover forms an EMC-screen for the electronic circuit.

Since the electronic circuit 4 will generate a certain amount of heat when in operation, it is necessary to ensure that heat will be carried away from the unit. To this end, the base plate 2 is constructed from a thermally conductive material, such as aluminium, and is also provided with cooling fins 6 which project outwardly from the base plate within the region of the electronic circuit but which are directed in opposite directions relative thereto. In order to further enlarge the heat-dispersing surface, the base plate 2 may be extended in a direction away from the connector 3. This extension 7 will, at the same time, form a handgrip which facilitates handling of the function unit.

The cover 5 is also configured to facilitate the dispersion of heat. Thus, the cover is provided with a recess 8, which extends across the function unit. This recess creates a space for a cooling-air channel between the cover and those plug-in function units mounted adjacent thereto, as illustrated more clearly in FIG. 3.

Figure 3:
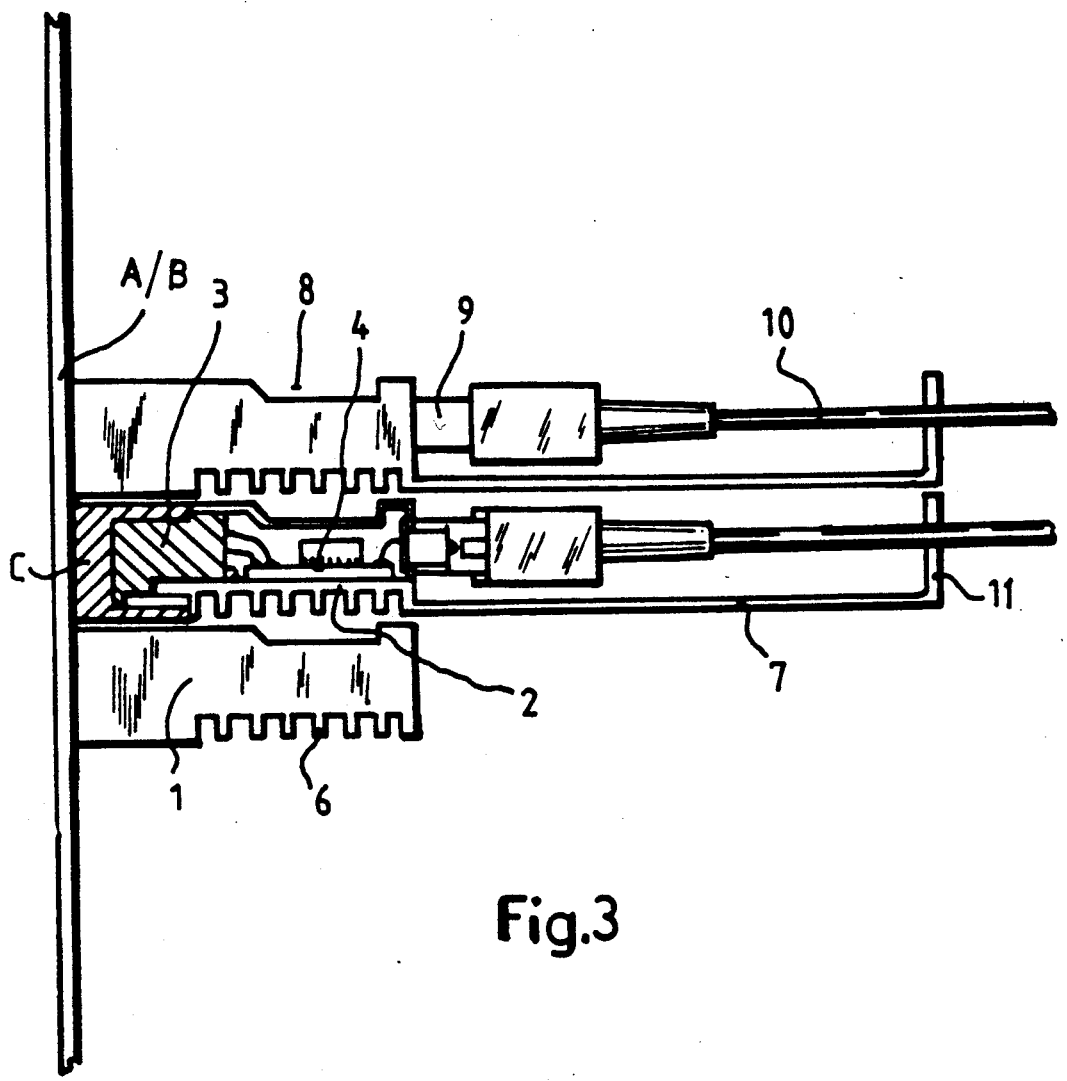
FIG. 3 illustrates by way of example three mutually adjacent plug-in active function units of different constructions.

FIG. 3 illustrates, by way of example, several plug-in function units 1 arranged in mutually adjacent relationship. One of these units is constructed essentially in accordance with the aforedescribed embodiment, but with no cooling-amplifying extension 7 of the base plate 2. The remaining function units are constructed in accordance with another embodiment of the present invention. In the case of this embodiment, the function unit 1 is provided with a connector 9 for an incoming or outgoing cable 10, which may be a coaxial cable, an optic fibre or the like. The connector 9 is mounted on the base plate 2 at the end thereof opposite to the connector 3, and is connected to the electronic circuit 4. In this case, the cover 5 is constructed so as to adjoin the connector 9. The base plate 2 of this embodiment may also have an extension 7 for enlarging the cooling surface, said extension also functioning as a handgrip and therewith facilitating handling of the unit. In order to facilitate handling of the unit still further, the extension 7 may be bent to a right angle, to form a grip flange 11. This grip flange is suitably provided with a lead-through or guide for the cable 10.

The dimensions of the function unit are such that its geometrical projection onto the circuit board A or the back plane B when plugged in position falls within the dimensions of the plug contact device C. This enables the function units to be plugged-in both vertically and horizontally in side-by-side relationship, independently of one another, which provides a highly compact building facility. A cooling-air channel operative to achieve effective heat dispersion is formed between the cooling fins 6 of one function unit and the recess 8 in the cover of a mutually adjacent function unit.

It will be understood that the invention is not restricted to the aforedescribed and illustrated embodiments, and that modifications can be made within the scope of the following claims.

We claim:

1. An active plug-in function unit intended to be plugged into a multipolar plug contact device mounted on a circuit board or a back plane, said function unit comprising:
   a base plate;
   a connector;
   an electronic circuit; and
   a cover, wherein said connector includes a module-type multipolar sleeve connector mounted on one end of said base plate and forms a mechanically separable electrical interface between said function unit and the circuit board or back plane, wherein said base plate extends in a direction in which said sleeve connector extends, wherein said electronic circuit is mounted on said base plate and is connected to said sleeve connector, wherein a cover is mounted over said electronic circuit and forms together with said base plate and said connector and EMC-screen around said circuit, and wherein a geometrical projection of said function unit onto a plane of a face of the plug contact device, when said function unit is plugged into the circuit board or the back plane, falls within the dimensions of the face of the plug contact device.

2. A unit according to claim 1, wherein said base plate is provided, in the region of said electronic circuit, with cooling fins which project out at right angles in a direction opposite to said circuit.

3. A unit according to claim 1, wherein said cover is provided with a recess which extends transversely across said unit and which functions to form a cooling-air channel within said function unit.

4. A unit according to claim 1, wherein said electronic circuit includes a substrate or a circuit board glued on said base plate and connected to said sleeve connector.

5. A unit according to claim 4, wherein said electronic circuit includes a DC/DC-rectifier.

6. A unit according to claim 1, wherein said base plate includes on a side thereof opposite to said sleeve connector a connecting means which forms a mechanically separable interface to an incoming or outgoing cable.

7. A unit according to claim 6, wherein said electronic circuit includes a signal-adapting converter such as an opto-electrical converter.

8. A unit according to claim 6, wherein said electronic circuit includes a signal filter and/or a signal protector.

9. A unit according to claim 1, wherein said base plate includes an extension which extends from said sleeve connector and which functions as a cooling flange and as a handgrip from facilitating handling of said function unit.

10. A unit according to claim 4, wherein said electronic circuit includes a power filter.

11. An active plug-in function unit for plugging into a multipolar contact device mounted on a circuit board, comprising:
    a base plate;
    a connector, said connector including a module-type multipolar sleeve connector mounted on one end of said base plate and forming a mechanically-separable electrical interface between said function unit and the circuit board;
    an electronic circuit board mounted on said base plate and connected to said sleeve connector; and
    a cover, said cover being mounted over said electronic circuit and forming, together with said base plate and said connector, an EMC-screen around said electronic circuit,
    wherein said base plate extends in a direction in which said sleeve connector extends, and includes an extension which extends from said sleeve connector and which functions as a cooling flange and as a handgrip for facilitating handling of said function unit, said extension being bent to an angle at its outer end to form a grip flange, said grip flange including a lead-through guide for a cable connected to said function unit.

* * * * *